United States Patent
Cox et al.

(10) Patent No.: US 12,127,361 B2
(45) Date of Patent: Oct. 22, 2024

(54) MODULAR MEMORY DEVICES

(71) Applicant: MONTAGE ELECTRONICS (SHANGHAI) CO., LTD., Shanghai (CN)

(72) Inventors: Christopher Cox, San Jose, CA (US); Leechung Yiu, San Jose, CA (US); Robert Xi Jin, San Jose, CA (US); Zheng Qiu, Shanghai (CN); Leonard Datus, San Jose, CA (US); Lizhi Jin, San Jose, CA (US)

(73) Assignee: MONTAGE ELECTRONICS (SHANGHAI) CO, Shanghai (CN)

( * ) Notice: Subject to any disclaimer, the term of this patent is extended or adjusted under 35 U.S.C. 154(b) by 396 days.

(21) Appl. No.: 17/577,393

(22) Filed: Jan. 18, 2022

(65) Prior Publication Data
US 2023/0232557 A1 Jul. 20, 2023

(30) Foreign Application Priority Data
Jan. 6, 2022 (CN) .......................... 202210009083.5

(51) Int. Cl.
*G11C 5/04* (2006.01)
*H05K 5/00* (2006.01)
(Continued)

(52) U.S. Cl.
CPC ............... *H05K 5/026* (2013.01); *G11C 5/04* (2013.01); *H05K 5/0026* (2013.01); *H05K 7/1427* (2013.01); *H05K 7/20445* (2013.01)

(58) Field of Classification Search
CPC ........ G11C 5/04; H05K 5/026; H05K 5/0026; H05K 7/1427; H05K 7/20445
(Continued)

(56) References Cited

U.S. PATENT DOCUMENTS 5,663,901 A * 9/1997 Wallace ................ G06F 13/385
365/185.11
10,387,064 B2 * 8/2019 Kim ........................ G06F 21/78
(Continued)

FOREIGN PATENT DOCUMENTS

CN 101685671 A 3/2010
CN 104137184 A 11/2014

OTHER PUBLICATIONS

The first office action of the corresponding Chinese application 202210009083.5, mailed on Mar. 12, 2023.

*Primary Examiner* — Sung Il Cho
(74) *Attorney, Agent, or Firm* — Jun He Law Offices P.C; James J. Zhu (57) ABSTRACT

The present application provides a memory device. The memory device includes a connector plate having a front edge and a rear edge opposite to the front edge, wherein the connector plate comprises an edge connector disposed at the rear edge and configured to connect to a host connector of a host device; a controller plate defining a first connection region, a second connection region and a chip region, wherein the controller plate is attached to the connector plate at the first connection region, and the controller plate comprises a memory control module disposed in the chip region and in electrical communication with the edge connector; and at least one memory module detachably connected to the controller plate at the second connection region of the controller plate, wherein each of the at least one memory module is in electrical communication with the memory control module when the memory module is connected to the controller plate, such that the memory module can be accessible by the host device via the memory control module.

19 Claims, 8 Drawing Sheets

(51) Int. Cl.
 *H05K 5/02* (2006.01)
 *H05K 7/14* (2006.01)
 *H05K 7/20* (2006.01)

(58) Field of Classification Search
 USPC .......................................................... 365/63
 See application file for complete search history.

(56) References Cited

U.S. PATENT DOCUMENTS

| | | | |
|---|---|---|---|
| 10,545,901 B2* | 1/2020 | Seiler | G06F 13/1678 |
| 2010/0296236 A1* | 11/2010 | Schuette | G06F 3/0658 |
| | | | 29/829 |
| 2017/0071075 A1* | 3/2017 | Hayakawa | H05K 5/0278 |
| 2018/0249585 A1* | 8/2018 | Yoshida | H05K 1/181 |
| 2024/0114638 A1* | 4/2024 | Cinar | H01R 12/721 |

* cited by examiner

MODULAR MEMORY DEVICES

TECHNICAL FIELD

The application generally relates to memory technology, and particularly to modular memory devices with replaceable memory module(s).

BACKGROUND

Solid-state drives (SSDs) are commonly used in client, hyperscale and enterprise compute environments, which can be built in many different form factors. Enterprise and Data Center Standard Form Factor (EDSFF) E3 is a family of form factors designed to update and replace the traditional U.2 2.5-inch form factor in servers and storage systems, and is intended for use in enclosures that fit within either a 1U or a 2U space (e.g., 1U refers to 1 standard unit of an IT equipment rack and the IT enclosures that fit in this space). All versions of the E3 family should be slot/connector compatible and are designed to be front accessible. A card edge connector as defined in SFF-TA-1002 can be used to electrically connect the E3 device to a host system such as a server.

However, there is a need for further improvement to the existing memory devices.

SUMMARY

An objective of the present application is to provide a memory device with a modular design.

In an aspect of the present application, there is provided a memory device. The memory device includes a connector plate having a front edge and a rear edge opposite to the front edge, wherein the connector plate comprises an edge connector disposed at the rear edge and configured to connect to a host connector of a host device; a controller plate defining a first connection region, a second connection region and a chip region, wherein the controller plate is attached to the connector plate at the first connection region, and the controller plate comprises a memory control module disposed in the chip region and in electrical communication with the edge connector; and at least one memory module detachably connected to the controller plate at the second connection region of the controller plate, wherein each of the at least one memory module is in electrical communication with the memory control module when the memory module is connected to the controller plate, such that the memory module can be accessible by the host device via the memory control module.

In an embodiment, the chip region is between the first connection region and the second connection region.

In an embodiment, the second connection region does not overlay with the connector plate.

In an embodiment, the controller plate comprises a bottom side facing the connector plate and a top side opposite to the bottom side, and the memory control module is disposed on the top side of the controller plate.

In an embodiment, the at least one memory module comprises a first memory module connected to the top side of the controller plate and a second memory module connected to the bottom side of the controller plate.

In an embodiment, the second memory module is at the same layer as the connector plate.

In an embodiment, the memory device further comprising a heat conductive layer disposed between the first memory module and the second memory module.

In an embodiment, the at least one memory module comprises a memory module connected to the top side of the controller plate at the second connection region of the controller plate.

In an embodiment, the memory device further comprising a heatsink disposed on the memory control module.

In an embodiment, the memory device further comprising a chassis for enclosing the connector plate, the controller plate and the at least one memory module.

In an embodiment, the chassis comprises an opening close to the rear edge of the connector plate and through which the edge connector protrudes out of the chassis.

In an embodiment, the memory device further comprising: a first set of retention pins passing through the connector plate and the controller plate at the first connection region of the controller plate, wherein the first set of retention pins are configured to secure the connector plate and the controller plate to the chassis.

In an embodiment, the memory device further comprising: a second set of retention pins passing through at least one of the connector plate and the controller plate and disposed close to the front edge of the controller plate, wherein the second set of retention pins are configured to secure the connector plate with the controller plate.

In an embodiment, the memory device further comprising: a third set of retention pins passing through the controller plate and the at least one memory module at the second connection region of the controller plate, wherein the third set of retention pins are configured to secure the controller plate and the at least one memory module to the chassis.

In an embodiment, the memory device further comprising: a fourth set of retention pins passing through the at least one memory module, wherein the fourth set of retention pins are configured to secure the at least one memory module to the chassis.

In an embodiment, the memory device further comprising a heat conductive layer disposed between one of the at least one memory module and the chassis.

In an embodiment, each of the at least one memory module is a single-sided memory module or a double-sided memory module.

In an embodiment, the edge connector is compatible with the SFF-TA-1002 standard.

In an embodiment, the memory device further comprising: a first flexible cable configured to electrically connect the edge connector with the memory control module; and at least one second flexible cable configured to electrically connect the memory control module with the at least one memory module, respectively.

In another aspect of the present application, there is provided a memory device. The memory device includes a connector plate having a front edge and a rear edge opposite to the front edge, wherein the connector plate includes: an edge connector disposed at the rear edge and configured to connect to a host connector of a host device; and a memory control module disposed on the connector plate and in electrical communication with the edge connector; a bridge plate defining a first connection region and a second connection region, wherein the bridge plate is attached to the connector plate at the first connection region; and at least one memory module detachably connected to the bridge plate at the second connection region of the bridge plate, wherein each of the at least one memory module is in electrical communication with the memory control module when the memory module is connected to the bridge plate, such that the memory module can be accessible by the host device via the memory control module.

In another aspect of the present application, there is provided a memory device. The memory device includes a connector plate having a front edge and a rear edge opposite to the front edge, and defining a connection region and a chip region between the rear edge and the front edge, wherein the connector plate comprises: an edge connector disposed at the rear edge and configured to connect to a host connector of a host device; a memory control module disposed in the chip region and in electrical communication with the edge connector; and a memory module detachably connected to the connector plate at the connection region of the connector plate, wherein the memory module is in electrical communication with the memory control module when the memory module is connected to the connector plate, such that the memory module can be accessible by the host device via the memory control module.

In an embodiment, the connection region does not overlay with the connector plate.

The foregoing is an overview of the present application, which may simplify, summarize, and omit details. Those skilled in the art will appreciate that this section is merely illustrative and not intended to limit the scope of the present application in any way. This summary section is neither intended to identify key features or essential features of the claimed subject matter nor intended to act as an auxiliary means for determining the scope of the claimed subject matter.

BRIEF DESCRIPTION OF THE DRAWINGS

The foregoing and other features of the present application will be more fully understood from the following description and the appended claims taken in conjunction with the accompanying drawings. It is to be understood that these drawings depict only a few embodiments of the contents of the present application and should not be construed as limiting the scope of the present application. The contents of the present application will be illustrated more clearly and in more detail with the accompanying drawings.

DETAILED DESCRIPTION OF THE EMBODIMENTS

In the following detailed description, reference is made to the accompanying drawings which form a part hereof. In the drawings, similar reference numerals generally refer to similar parts unless the context clearly dictates otherwise. The illustrative embodiments described in the detailed description, drawings and claims are not intended to be limiting. Other embodiments may be employed, and other changes may be made without departing from the spirit or scope of the subject matter of the present application. It is to be understood that various configurations, substitutions, combinations, and designs of the various forms of the present application, which are generally described in this application and are illustrated in the drawings, are intended to constitute a part of the present application.

Throughout the context of this application, "layer" means a spatial level within which the components can be arranged. When some of the components are arranged in one layer, it means that these components are generally at the same height with reference to a base plane, for example, a plate. The plate described herein may be implemented as a circuit board, for example, a printed circuit board (PCB).

FIGS. 1a to 4b described with the following embodiments are drawn in a planar view in collaboration with a front view thereof. These figures are not drawn in scale, and some parts are exaggerated to illustrate the principles of the present application more clearly.

Figure 1A:
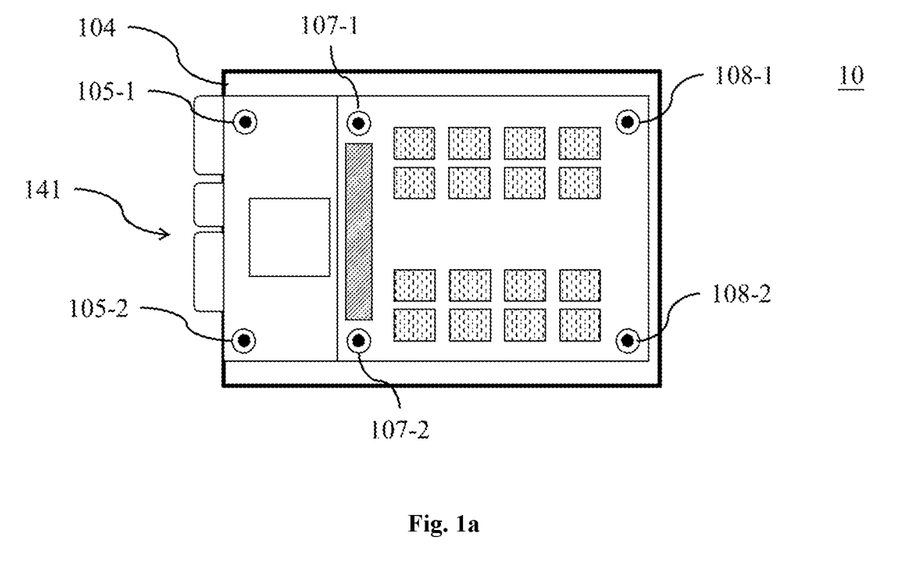
FIG. 1a shows an exemplary memory device 10 with a modular design according to an embodiment of the present application.
Figure 1B:
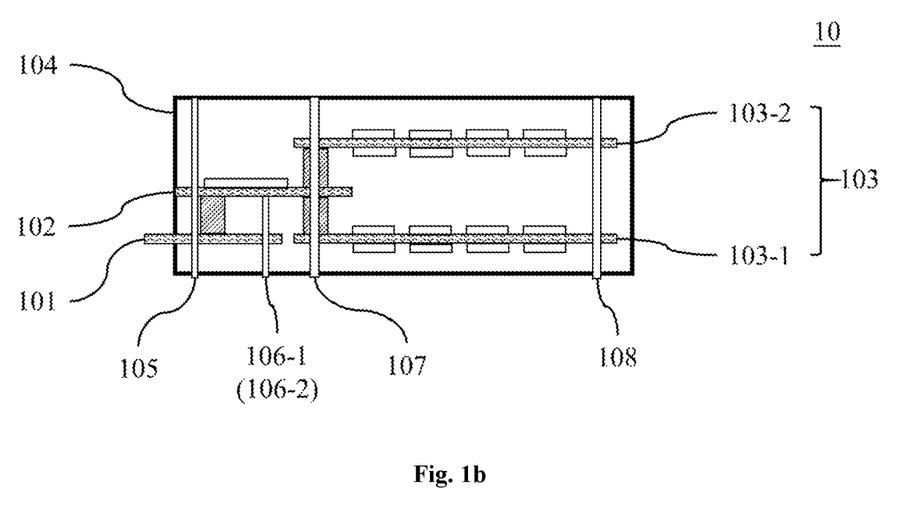
FIG. 1b shows a front view thereof.

FIGS. 1a and 1b show a memory device 10 with a modular design according to an embodiment of the present application. FIGS. 2a, 1b, 3a and 3b show a connector plate and a controller plate of the memory device 10 shown in FIGS. 1a and 1b.

As shown in FIGS. 1a, 1b, 2a and 2b, the memory device 10 includes a connector plate 101, which has a front edge 201 and a rear edge 202 opposite to each other. In some embodiments, the front edge 201 can be disposed within a chassis 104 that encloses the connector plate 101 and various other components of the memory device 10, while the rear edge 202 can be displaced out of the chassis 104. The connector plate 101 further includes an edge connector 203, which is disposed at the rear edge 202. The edge connector 203 can connect to a host connector of a host device (not shown for simplicity) to enable electrical communication therebetween. Although shown as three separate parts in the embodiment of FIG. 1a, the edge connector 203 can be built in various other forms, for example, depending on what standard the host connector is compatible with. In some embodiments, the edge connector 203 can be in form of single-sided or double-sided "golden fingers" (i.e. contacts) that is known in the industry. In an embodiment, the edge connector 203 can be compatible with the SFF-TA-1002 standard. The SFF-TA-1002 standard defines an unshielded, input/output, card edge connector and mating card interface which is configurable for straight, right angle, straddle mount, and orthogonal applications. The SFF-TA-1002 standard and some other relevant SFF standards including the SFF-TA-1006, SFF-TA-1008, SFF-TA-1009 standards can be found at the SNIA official website (www.snia.org/technology-communities/sff/specifications), the entire contents of which are incorporated herein by reference. Being compatible with the existing edge connector standards, the memory devices according to the embodiments of the present application can be directly connected to existing devices, for example, the host devices that have SFF-TA-1002 connectors or ports. The host device described herein may be a computer or a smart device that may need additional memory devices for data storage purposes.

Figure 2A:
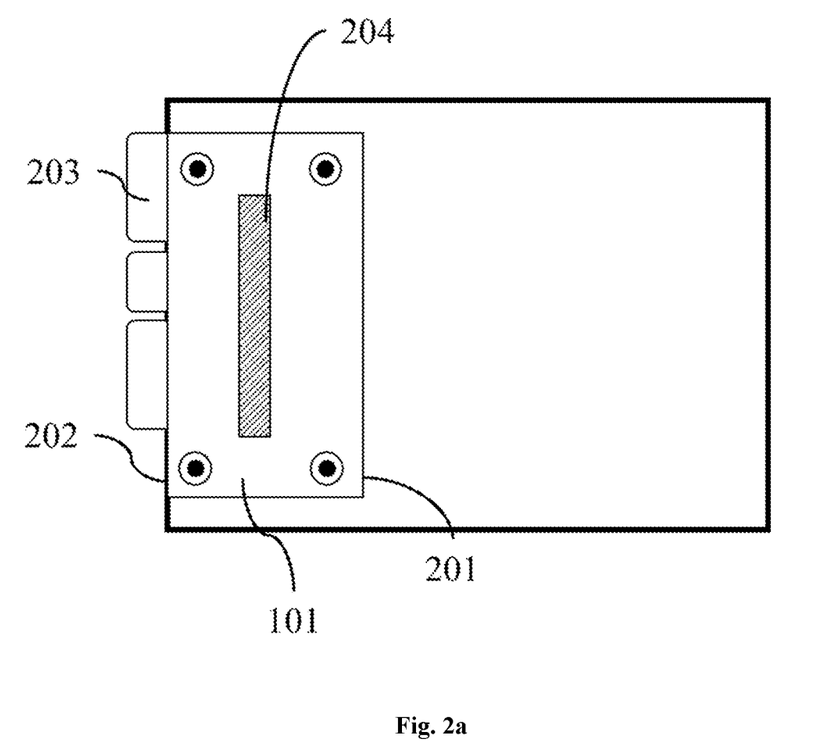
FIG. 2a shows an exemplary connector plate 101 of the memory device 10 shown in FIGS. 1a and 1b.
Figure 2B:
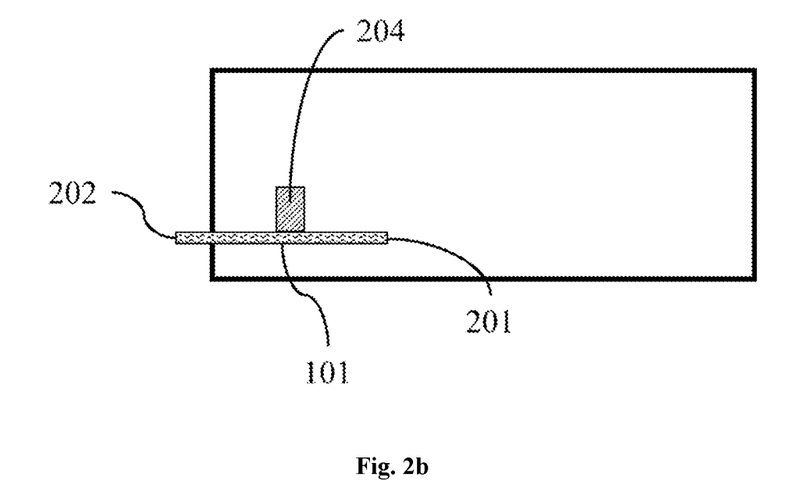
FIG. 2b shows a front view thereof.
Figure 3A:
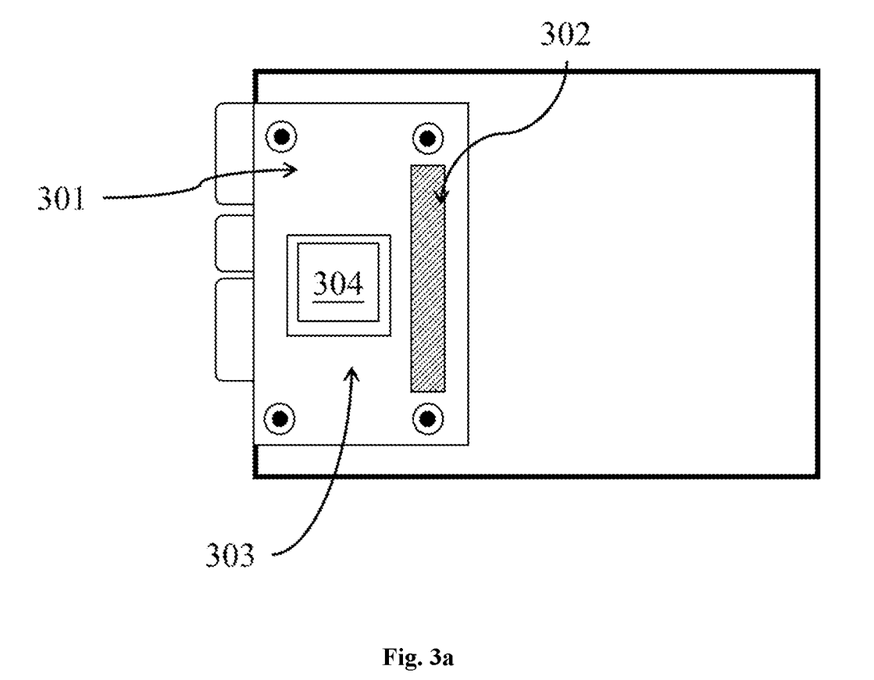
FIG. 3a shows an exemplary controller plate 102 of the memory device 10 shown in FIGS. 1a and 1b.
Figure 3B:
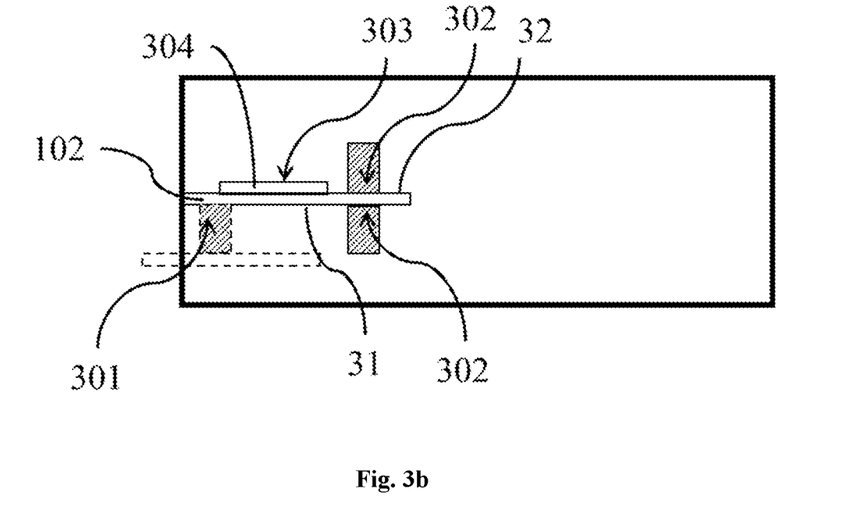
FIG. 3b shows a front view thereof.

Referring to FIGS. 1a, 1b, 3a and 3b, the memory device 10 further includes a controller plate 102, which is electrically connected to the connector plate 101. As shown in FIGS. 3a and 3b, the controller plate 102 defines a first connection region 301, a second connection region 302, and a chip region 303 between the first and second connection regions. The connection regions described herein may extend across the entire control plate 102 from one side to another. The controller plate 102 includes a memory control module 304 that handles control tasks for the memory device 10. The memory control module (chip) 304 is disposed in the chip region 303 and is in electrical communication with the edge connector 203 as shown in FIG. 2a via wires, cables, contacts or other electrical connection features that will be elaborated below. Since the memory control module 304 resides in the chip region 303 and handles control tasks of the memory device 10, the chip region 303 can be deemed as a "hub" of the memory device 10 in the dimension of information and data. It can be appreciated that although a single memory control module 304 is shown in FIGS. 3a and 3b, some other circuit components can be disposed in the controller plate 102, including other circuit modules or discrete components. Furthermore, although it is shown in FIGS. 3a and 3b that the memory control module 304 is mounted on a top side of the controller plate 102, one or more other circuit components can be mounted on the top side or a bottom side of the controller plate 102.

With further reference to FIGS. 1a to 3b, the controller plate 102 is attached to the connector plate 101 at the first connection region 301. In an embodiment, the first connection region 301 may be used to bridge the connector plate 101 and the controller plate 102 and thus provide an electrical connection therebetween. For example, the controller plate 102 may provide a mezz connector in the form of sockets (or pins) at the first connection region 301. A mezz connector 204 in the form of pins (or sockets) of the connector plate 101 can be inserted into the mezz connector of the controller plate for setting up the connection. Bridging with mezz connectors may save components while raising a strict requirement for alignment between the mezz connectors. In some other embodiments, the controller plate 102 and the connector plate 101 can be bridged by a flexible cable (or flex card), which can reduce or avoid the requirement for alignment of different plates. For example, an end of the flexible cable can be connected to the first connection region 301 in the controller plate 102, and another end of the flexible cable can be connected to the connector plate 101, for example, close to its front edge. Accordingly, the information and data can be transmitted to or out of the memory control module 304.

Figure 6:
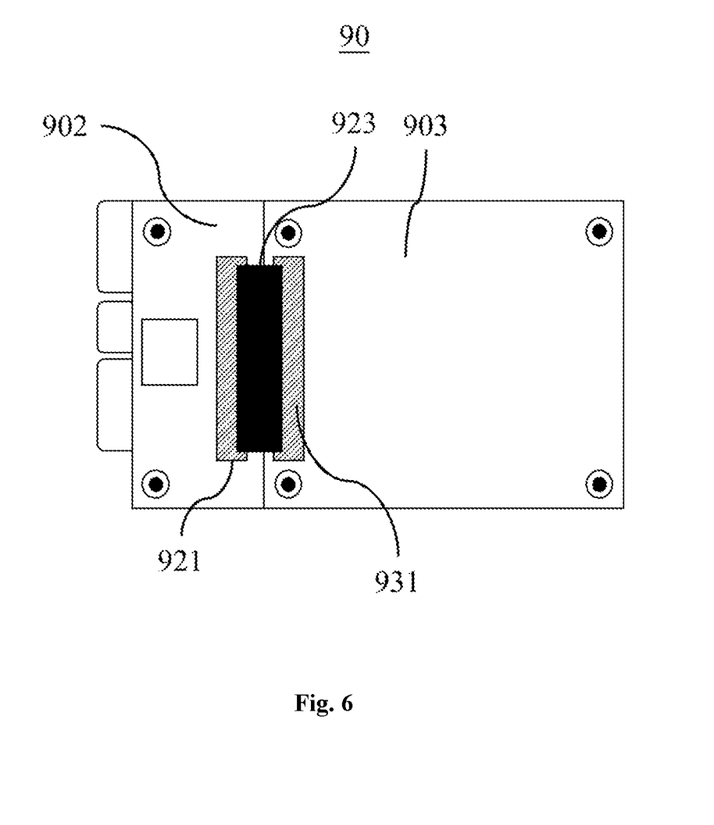
FIG. 6 shows an exemplary connection between a controller plate and a memory module of a memory device according to an embodiment of the present application.

Referring to FIGS. 1a, 1b, 3a and 3b, the memory device 10 further includes at least one memory module 103, which is detachably connected to the controller plate 102 at the second connection region 302 of the controller plate 102. The second connection region 302 provides an electrical connection between the controller plate 102 and the memory module 103. In some embodiments, the second connection region 302 can be of a zone or two zones according to the number of the memory modules to be installed. If there is only one zone, it can be on either side of the controller plate 102. If there are two zones, they can be designed as facing each other on each side. Through this electrical connection, the memory module can be accessible and managed by the memory control module 304. Although the memory module 103 is shown with two modules 103-1 and 103-2 in FIG. 1b, in other examples, the number of the memory module 103 can vary. For example, one of the memory modules 103-1 and 103-2 can be removed. In some other embodiments, as shown in FIG. 6, the connection between the memory module 903 and the controller plate 902 of the memory device 90 can be realized by a flexible cable (or flex card) 923. A first connector 921 of the flexible cable 923 resides in the second connection region of the controller plate 902, and another corresponding connector 923 of the flexible cable 923 resides in a region of the memory module 903. The flexible cable 923 can be used to bridge the controller plate 902 and the memory module 903 by setting up power and information connection between the connector 921 and the connector 931.

In some embodiments, memory chips of the memory module 103-1 and 103-2 be can be compatible with the JEDEC standards such as the JESD79-4 (DDR4) and JESD79-5 (DDR5) standards. The memory device of the embodiments of the present application can include at least two layers of such memory modules. For example, when the memory device of the embodiments of the present application uses an SNIA E3 chassis which is about 102.123 mm*76.00 mm*16.81 mm in size, and a DDR5 memory module can be of 74.6325 mm (<102.123 mm) in length, 64.00 mm (<76.00 mm) in width. Thus, the SNIA E3 chassis can be used to accommodate the DDR5 memory modules. Moreover, when two DDR5 memory modules are stacked with a controller plate, the total height is about 10.5 mm (<16.81 mm) and hence there are still enough place for mounting and heat dissipation. Each of the memory modules 103-1 and 103-2 can be in electrical communication with the memory control module 304 when they are connected to the controller plate 102. It should be noted that the memory modules compatible with the JEDEC standards are merely examples of memory module that can be connected to the controller plate, and in practice various other types of memory modules (e.g. flash memory modules) can be connected to the controller plate as long as the spatial requirement within the chassis can be satisfied.

Figure 5A:
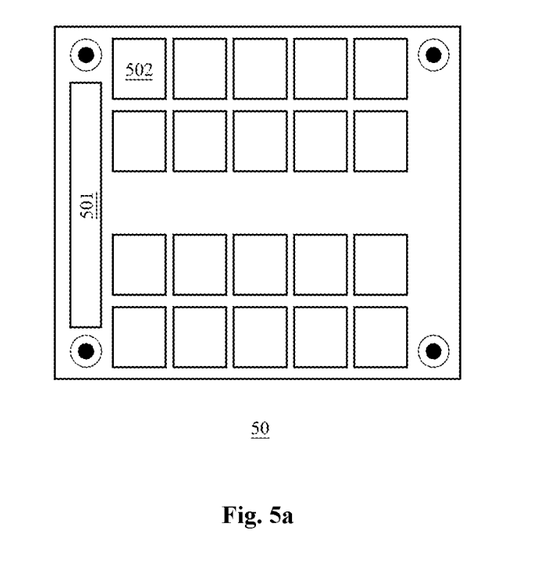
FIGS. 5a to 5d show exemplary memory modules that may be connected to the memory devices according to embodiments of the present application.
Figure 5B:
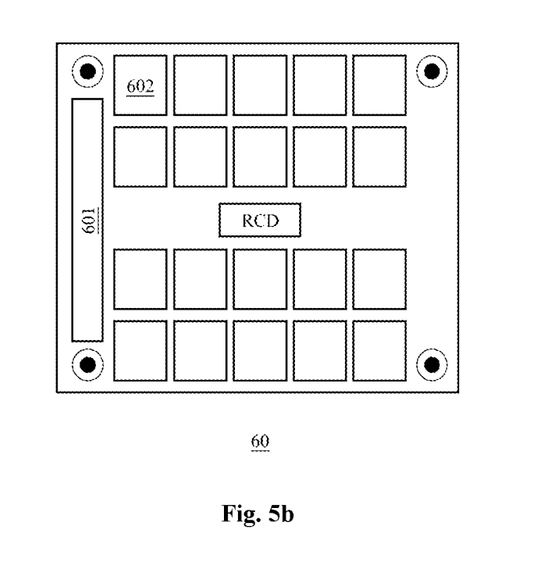
Figure 5C:
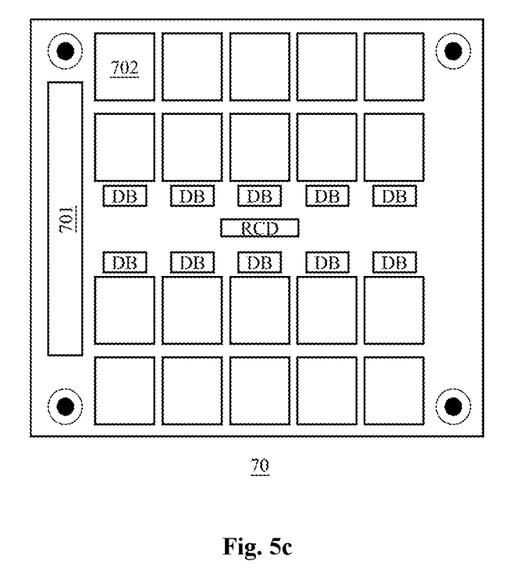
Figure 5D:
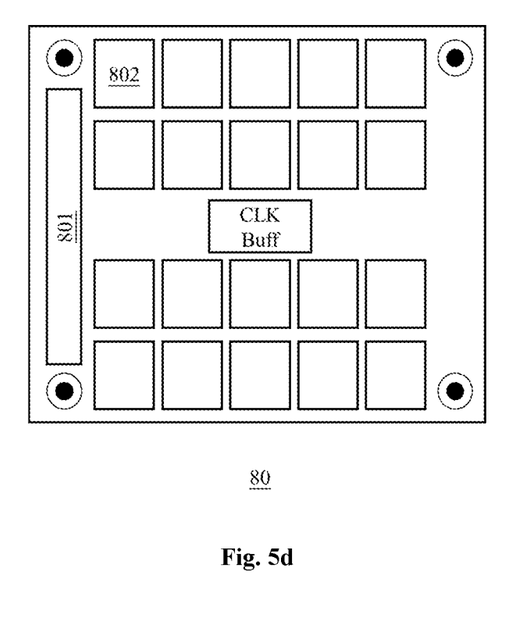

In some examples, the memory module 103 can be a single-sided memory module or a double-sided memory module. Several exemplary memory modules are shown in FIGS. 5a to 5d. FIG. 5a shows a traditional unbuffered memory module 50 with two ranks of memory chips 502 and a connector 501 for connecting to the controller plate. FIG. 5b shows a traditional registered memory module 60 with two ranks of memory chips 602, a connector 601 and a register clock driver (RCD) chip. FIG. 5c shows a buffered memory module 70 with a connector 701 and data buffers that buffer data between memory chips 702 and an RCD chip. FIG. 5d shows a memory module 80 with two ranks of memory chips 802, and a clock (CLK) buffer chip. Please note that only one side of the memory modules are shown in FIGS. 5a to 5d, and optionally the other side of the memory modules can have similar layouts.

Referring back to FIGS. 1a, 1b, 3a and 3b, the chip region 303 can be placed between the first connection region 301 and the second connection region 302. As the chip region 303 is the "central region" of the controller plate 102 and hence the memory device 10, arranging the chip region 303 at a non-periphery position may at least benefit the layout and wiring of the controller plate 102. Furthermore, it is also a practical approach by avoiding the conflict between the memory control module 304 and the memory modules 103 in space. As the memory control module 304 can be embedded at the chip region 303 while the memory modules 103 can be coupled at the second connection region 302, the memory control module 304 and the memory modules 103 can be slightly straggled in space. However, in some other embodiments, the chip region 303 may not be disposed between the first and the second connection regions.

In some embodiments, the second connection region 302 may not overlay with the connector plate 101. Moreover, to avoid the conflict between the controller plate 102 and the potential memory modules to be coupled to the second connection region 302, the connector plate 101 and the second connection region 302 can be spatially irrelative with each other, for example, each one may have no projective area onto another. In other words, when viewed vertically, the second connection region 302 does not overlap with the connector plate 101.

In some embodiments, as shown in FIGS. 1a, 2a, 3a and 3b, the controller plate 102 includes a bottom side 31 facing the connector plate 101 and a top side 32 opposite to the bottom side. The memory control module 304 may be disposed on the top side 32 of the controller plate 102, and the first connection region 301 may be disposed on the bottom side 31 facing the connector plate 101, which can facilitate the connection between the connector plate 101 and the controller plate 102. With the first connection region 301 and the chip region 303 arranged on two opposite sides, more area may be provided for the mechanical connection between the connector plate 101 and the controller plate 102, so as to strengthen the connection between them.

In some embodiments, the memory modules 103-1 and 103-2 may each be connected to a side of the controller plate 102. As illustrated, the first memory module 103-1 is connected to the bottom side 31 of the controller plate 102 and the second memory module 103-2 is connected to the top side 32 of the controller plate 102. In other words, the memory control module 304 and the memory modules 103-1 and 103-2 can reside in different layers inside the chassis. Optionally, the second memory module 103-2 can be generally at the same layer as the connector plate 101, which may be close to the bottom of the chassis as defined in the EDSFF E3 standard.

In some embodiments, there may be only one memory module connected to the top side 32 at the second connection region 302 of the controller plate 102, or only one memory module connected to the bottom side 31 of the controller plate 102. The modular design of the memory device 10 makes it possible to accommodate different numbers of the memory modules to fulfill different requirements. Also, the users can select memory modules with different sizes of storage to connect in practice.

Figure 4A:
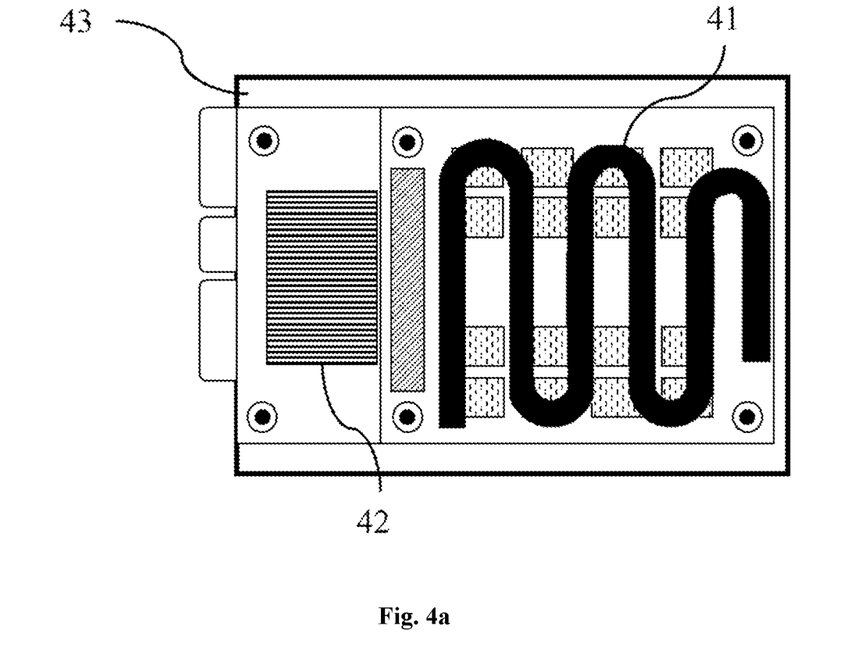
FIG. 4a shows an exemplary memory device 40 with a modular design according to an embodiment of the present application.
Figure 4B:
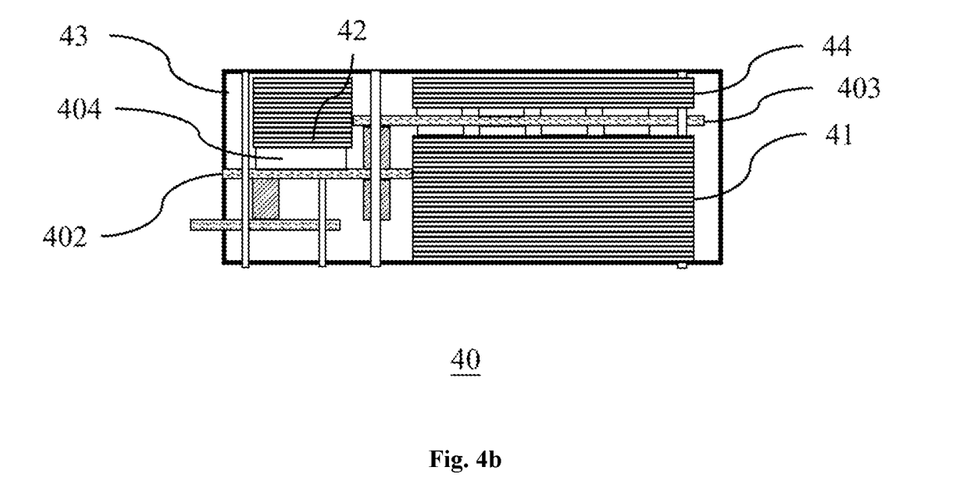
FIG. 4b shows a front view thereof.

FIGS. 4a and 4b show a memory device 40 with a modular design according to an embodiment of the present application. In some of the implementations of this application, in addition to the layout of the memory device 10, the memory device 40 further includes a heat conductive layer 41 disposed adjacent to the memory module 403 for heat dissipation. The heat conductive layer 41 can be formed as a serpentine strip or cable that extends over most or all memory chips of the memory modules towards at least an edge of the chassis to dissipate heat from these memory chips to the chassis. Alternatively, the heat conductive layer 41 can be formed as two or more strips each extending over a portion of the memory chips of the memory modules. In some other embodiments, the heat conductive layer 41 may be a heat conductive plate that covers the memory chips of the memory modules. In some embodiments, the heat conductive layer 41 can be disposed between the memory modules if there are more than one module for the thermal dissipation thereof.

In one embodiment, continue to refer to FIGS. 4a and 4b, the memory device 40 further includes a heatsink 42 disposed on the memory control module 404 (shown as disposed on the top side of the controller plate 402) for heat dissipation. For example, the heatsink 42 can be in contact with both the memory control module 404 and the chassis 43 to dissipate heat to the chassis 43. In this configuration, the heatsink 42 can be generally at the same layer as the first memory module 403 to maximize the usage of each layer. The memory device may further include a heat conductive layer 44 disposed between the memory module 403 and the chassis 43 for heat dissipation. Although it is shown that the heat conductive layer 44 is applicable for the memory module 403, the arrangement is also applicable for the approach with two memory modules.

Among some of the implementations above, the connector plate 101, the controller plate 102 and the memory module 103 each may reside in different layers to realize a compact layout of components therein. This compact approach will in turn make more space for the memory modules, which will further benefit flexibility of the arranging of memory modules.

As mentioned above, in the embodiments shown in FIGS. 1a to 4b, the chassis 104 is used for enclosing the connector plate 101, the controller plate 102, the memory module(s) 103, the heat conductive layer 41 and 43, the heatsink 42, and other necessary circuits or components, which can make the memory device in a complete form that is commercially available. The chassis 104 may also include an opening 141 close to the rear edge 202 of the connector plate 101, and through the opening 141 the edge connector 203 protrudes out of the chassis 104 for connecting to an outer host device.

In some examples, the chassis 104 is not only the housing or case of the memory device 10, but also a mounting base for other components of the memory device 10. Various retention pins or similar fasteners can be provided attached to the chassis 104 for securing the plates to the chassis 104.

In particular, as shown in FIGS. 1a and 1b, the memory device 10 may include a first set of retention pins 105 (pins 105-1 and 105-2 for illustrative only, other numbers and forms may be also applicable) passing through the connector plate 101 and the controller plate 102 at the first connection region 301 of the controller plate 102, wherein the first set of retention pins 105-1 and 105-2 can be used to secure the connector plate 101 and the controller plate 102 to the chassis 104. The memory device 10 may include a second set of retention pins 106-1 and 106-2 (for illustrative only, other numbers and forms may be also applicable) passing through at least one of the connector plate 101 and the controller plate 102 and disposed close to the front edge 201 of the controller plate 102. The second set of retention pins 106-1 and 106-2 can be used to secure the connector plate 101 with the controller plate 102. In addition, the memory device 10 may include a third set of retention pins 107 (pins 107-1 and 107-2 are for illustrative only, other numbers and forms may be also applicable) passing through the controller plate 102 and the at least one memory module 103 at the second connection region 302 of the controller plate 102. The third set of retention pins 107-1 and 107-2 can be used to secure the controller plate 102 and the at least one memory module 103 to the chassis 104. The memory device 10 may include a fourth set of retention pins 108 (pins 108-1 and 108-2 are for illustrative only, other numbers and forms may be also applicable) passing through the at least one memory module 103. The fourth set of retention pins 108-1 and 108-2 can be used to secure the at least one memory module to the chassis.

The aforementioned four sets of retention pins can be used to assemble a complete memory device within the chassis. When assembling the memory device, the mounting order can be in the following: the connector plate, the second memory module (the lower one if exits), the controller plate, and the first memory module (the upper one if exits). The pins described above can be realized by screws with rubber around.

Figure 7:
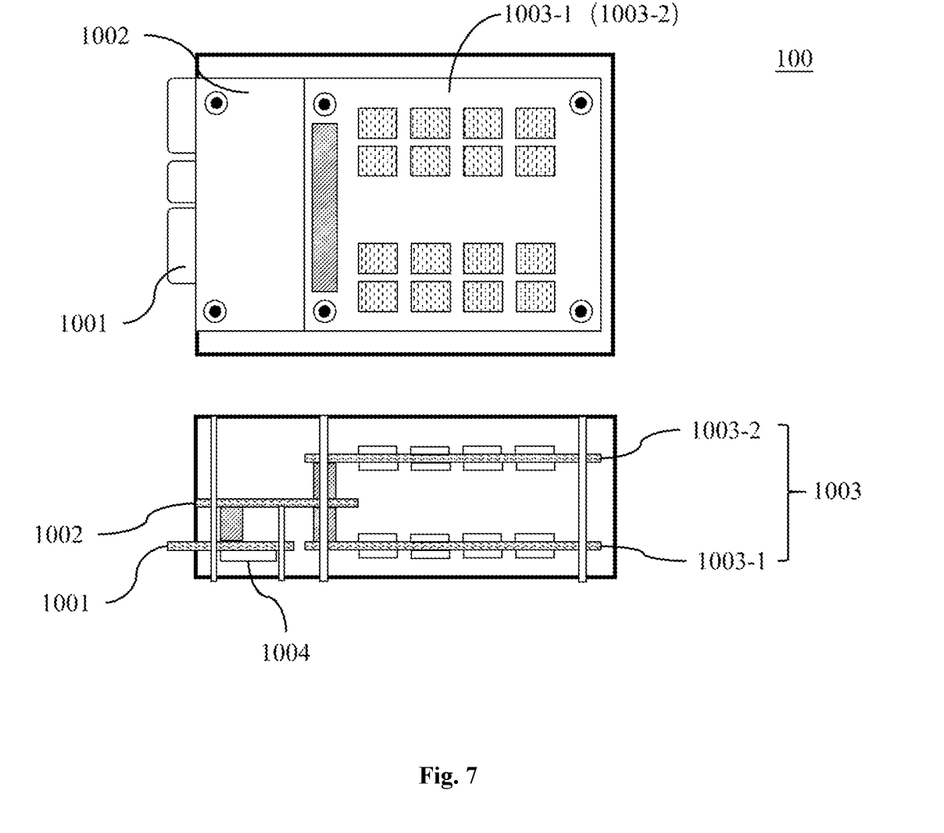
FIG. 7 shows an exemplary memory device 100 with a modular design according to an embodiment of the present application.

In another aspect of the present application, there is provided a memory device. Compared with the memory device described in the above embodiments, the memory control module can reside in the connector plate rather than in a separate controller plate, and hence the controller plate shown in FIGS. 1a to 4b and 6 may be considered as a bridge plate. Referring to FIG. 7, the memory device 100 includes a connector plate 1001, a bridge plate 1002, and memory modules 1003-1 and 1003-2, collectively the memory modules 1003. In other implementations, the number of the memory module(s) can be different.

As the examples described above, the connector plate 1001 includes a front edge and a rear edge opposite to the front edge. The connector plate 1001 further includes an edge connector disposed at the rear edge and configured to connect to a host connector of a host device. Still, the connector plate 1001 includes a memory control module 1004 disposed on the connector plate 1001 and in electrical communication with the edge connector. Although shown as being disposed on the bottom side of the connector plate 1001, but in other implementations, the memory control module 1004 can alternatively be disposed on the top side of the connector plate 1001, if applicable.

The bridge plate 1002 of the memory device 100 defines a first connection region and a second connection region, wherein the bridge plate 1002 can be attached to the connector plate 1001 at the first connection region.

The memory modules 1003 can be detachably connected to the bridge plate 1002 at the second connection region of the bridge plate 1002, wherein each of the memory modules 1003 is in electrical communication with the memory control module 1004 when the memory modules 1003 are connected to the bridge plate 1002, such that the memory modules 1003 can be accessible by the host device via the memory control module 1004.

In another aspect of the present application, there is provided another memory device. Compared with the memory device described in the above embodiments, the connector plate and the memory controller plate can be designed as one piece (e.g., collectively referred to as "the connector plate") in this modification. Specifically, the memory device includes (1) a connector plate having a front edge and a rear edge opposite to the front edge, and defining a connection region and a chip region between the rear edge and the front edge, wherein the connector plate comprises: (a) an edge connector disposed at the rear edge and configured to connect to a host connector of a host device; (b) a memory control module disposed in the chip region and in electrical communication with the edge connector; and (2) a memory module detachably connected to the connector plate at the connection region of the connector plate, wherein the memory module is in electrical communication with the memory control module when the memory module is connected to the connector plate, such that the memory module can be accessible by the host device via the memory control module.

It should be noted that although several modules or sub-modules of modular memory devices according to embodiments of the present application are described in the above description, this division is merely exemplary rather than mandatory. In fact, according to the embodiments of the present application, features and functions of two or more modules described above may be embodied in one module. Conversely, features and functions of one module described above can be further divided into a plurality of modules.

Those skilled in the art will be able to understand and implement other variations to the disclosed embodiments by studying the specification, the application, the drawings and the appended claims. In the claims, the words "include" or "including" do not exclude other elements and steps, and the words "a" or "an" do not exclude the plural. In the practical application of the present application, one part may perform the functions of a plurality of technical features cited in the claims. Any reference numerals in the claims should not be construed as limiting the scope.

What is claimed is:

1. A memory device, comprising:
a connector plate having a front edge and a rear edge opposite to the front edge, wherein the connector plate comprises an edge connector disposed at the rear edge and configured to connect to a host connector of a host device;
a controller plate defining a first connection region, a second connection region and a chip region, wherein the controller plate is attached to the connector plate at the first connection region, and the controller plate comprises a memory control module disposed in the chip region and in electrical communication with the edge connector; and
at least one memory module detachably connected to the controller plate at the second connection region of the controller plate, wherein each of the at least one memory module is in electrical communication with the memory control module when the memory module is connected to the controller plate, such that the memory module can be accessible by the host device via the memory control module;
wherein the at least one memory module comprises a first memory module and a second memory module, wherein the second memory module is at the same layer as the connector plate;
and wherein the connector plate is at a different layer from the controller plate.

2. The memory device of claim 1, wherein the chip region is between the first connection region and the second connection region.

3. The memory device of claim 2, wherein the second connection region does not overlay with the connector plate.

4. The memory device of claim 3, wherein the controller plate comprises a bottom side facing the connector plate and a top side opposite to the bottom side, and the memory control module is disposed on the top side of the controller plate.

5. The memory device of claim 4, wherein the first memory module is connected to the top side of the controller plate, and the second memory module is connected to the bottom side of the controller plate.

6. The memory device of claim 5, further comprising a heat conductive layer disposed between the first memory module and the second memory module.

7. The memory device of claim 4, wherein the at least one memory module comprises a memory module connected to the top side of the controller plate at the second connection region of the controller plate.

8. The memory device of claim 4, further comprising a heatsink disposed on the memory control module.

9. The memory device of claim 1, further comprising a chassis in which the connector plate, the controller plate and the at least one memory module are enclosed.

10. The memory device of claim 9, wherein the chassis comprises an opening close to the rear edge of the connector plate and through which the edge connector protrudes out of the chassis.

11. The memory device of claim 10, further comprising:
a first set of retention pins passing through the connector plate and the controller plate at the first connection region of the controller plate, wherein the first set of retention pins are configured to secure the connector plate and the controller plate to the chassis.

12. The memory device of claim 11, further comprising:
a second set of retention pins passing through at least one of the connector plate and the controller plate and disposed close to the front edge of the controller plate, wherein the second set of retention pins are configured to secure the connector plate with the controller plate.

13. The memory device of claim 10, further comprising:
a third set of retention pins passing through the controller plate and the at least one memory module at the second connection region of the controller plate, wherein the third set of retention pins are configured to secure the controller plate and the at least one memory module to the chassis.

14. The memory device of claim 13, further comprising:
a fourth set of retention pins passing through the at least one memory module, wherein the fourth set of retention pins are configured to secure the at least one memory module to the chassis.

15. The memory device of claim 9, further comprising a heat conductive layer disposed between one of the at least one memory module and the chassis.

16. The memory device of claim 1, wherein each of the at least one memory module is a single-sided memory module or a double-sided memory module.

17. The memory device of claim 1, wherein the edge connector is compatible with the SFF-TA-1002 standard.

18. The memory device of claim 1, further comprising:
a first flexible cable configured to electrically connect the edge connector with the memory control module; and
at least one second flexible cable configured to electrically connect the memory control module with the at least one memory module, respectively.

19. A memory device, comprising:
a connector plate having a front edge and a rear edge opposite to the front edge, wherein the connector plate comprises:
an edge connector disposed at the rear edge and configured to connect to a host connector of a host device; and
a memory control module disposed on the connector plate and in electrical communication with the edge connector;
a bridge plate defining a first connection region and a second connection region, wherein the bridge plate is attached to the connector plate at the first connection region; and
at least one memory module detachably connected to the bridge plate at the second connection region of the bridge plate, wherein each of the at least one memory module is in electrical communication with the memory control module when the memory module is connected to the bridge plate, such that the memory module can be accessible by the host device via the memory control module;
wherein the at least one memory module comprises a first memory module and a second memory module, wherein the second memory module is at the same layer as the connector plate.

* * * * *